United States Patent
Chang

(10) Patent No.: US 7,310,400 B2
(45) Date of Patent: Dec. 18, 2007

(54) DATA RECOVERY DEVICE AND METHOD

(75) Inventor: Yi-Shu Chang, HsinChu (TW)

(73) Assignee: Realtek Semiconductor Corp., Hsinchu (TW)

( * ) Notice: Subject to any disclaimer, the term of this patent is extended or adjusted under 35 U.S.C. 154(b) by 969 days.

(21) Appl. No.: 10/117,046

(22) Filed: Apr. 8, 2002

(65) Prior Publication Data

US 2002/0150192 A1 Oct. 17, 2002

(30) Foreign Application Priority Data

Apr. 16, 2001 (TW) ................................. 90109017

(51) Int. Cl.
*H03D 3/24* (2006.01)
*H04L 7/02* (2006.01)
*H04L 7/00* (2006.01)
*H04J 3/06* (2006.01)

(52) U.S. Cl. ...................... 375/376; 375/360; 375/340; 375/354; 375/355; 370/350

(58) Field of Classification Search ........ 375/375–376, 375/373, 327, 340, 358, 354–356, 326, 360, 375/350, 371, 357; 370/100.1, 105, 84, 108, 370/350, 304, 503, 305; 327/147, 144, 156
See application file for complete search history.

(56) References Cited

U.S. PATENT DOCUMENTS

| | | | |
|---|---|---|---|
| 5,287,359 A * | 2/1994 | Engelse | 370/503 |
| 5,764,712 A * | 6/1998 | Branstad et al. | 375/376 |
| 5,905,769 A * | 5/1999 | Lee et al. | 375/376 |
| 5,974,097 A * | 10/1999 | Julyan et al. | 375/340 |
| 6,374,361 B1 * | 4/2002 | Lee et al. | 713/503 |
| 6,587,525 B2 * | 7/2003 | Jeong et al. | 375/354 |
| 6,845,460 B2 * | 1/2005 | Lee et al. | 713/401 |
| 2002/0101947 A1 * | 8/2002 | Sumiyoshi | 375/376 |

* cited by examiner

*Primary Examiner*—Mohammed Ghayour
*Assistant Examiner*—Sophia Vlahos
(74) *Attorney, Agent, or Firm*—Rabin & Berdo, PC

(57) ABSTRACT

A data recovery device. The device adjusts a digital signal according to a pulse signal output by a phase-locked loop circuit. The sampling circuit samples each bit of the digital signal five times to generate a first sampled signal. The data delay buffer decides a sampling range of the first sampled signal and outputs a second sampled signal. The sampling range selector picks a part of bits of the second sampled signal and outputs output data. The weighted detecting module outputs a phase shifting signal responding to the output data. The first loop filter outputs a first adjusting signal. The first sampling window module outputs a phase selecting signal. The second loop filter outputs the recovery signal and a second adjusting signal. The second sampling window module outputs the first phase checking signal and the second phase checking signal. The phase picking module outputs the output data.

18 Claims, 8 Drawing Sheets

DATA RECOVERY DEVICE AND METHOD

BACKGROUND OF THE INVENTION

1. Field of the Invention

The present invention relates in general to a data recovery device. In particular, the present invention relates to a device and method for high-speed data recovery using feedback of the sampled digital data.

2. Description of the Related Art

Normally, image data transmitted between the host and the monitor of a computer is an analog signal. The decoder of the monitor transforms the analog image data to digital image data. However, the image data will fade after transformation from analog data to digital data.

Therefore, a transition minimized differential signal (TMDS) interface has been developed. The system transmits data in a digital form. However, the image data fades because of shifting of the data.

SUMMARY OF THE INVENTION

The object of the present invention is to provide a data recovery device to recover the faded image data by sampling the low voltage differential signal (LVDS) or transition minimized differential signal (TMDS) provided by the host, to improve the accuracy of the image data transformed by TMDS.

To achieve the above-mentioned object, the present invention provides a data recovery device to adjust a digital signal according to a pulse signal output by a phase-locked loop circuit. The data recovery device includes a sampling circuit, a data delay buffer, a sampling range selector, a weighted detecting module, a first loop filter, a first sampling window module, a second loop filter, a second sampling window module, and a phase picking module.

The sampling circuit samples each bit of the digital signal five times according to the pulse signal to generate a first sampling signal. The data delay buffer decides a sampling range of the first sampling signal according to a first phase checking signal and outputs a second sampling signal. The sampling range selector picks a part of bits of the second sampling signal according to a phase picking signal and outputs an output data. The weighted detecting module outputs a phase shifting signal responding to the output data. The first loop filter outputs a first adjusting signal according to the phase shifting signal. The first sampling window module outputs a phase selecting signal according to the first adjusting signal and a recovery signal. The second loop filter outputs the recovery signal and a second adjusting signal according to the phase selecting signal and a second phase checking signal. The second sampling window module outputs the first phase checking signal and the second phase checking signal according to the first adjusting signal and the second adjusting signal. The phase picking module outputs the output data.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE PREFERRED EMBODIMENT

Figure 1:
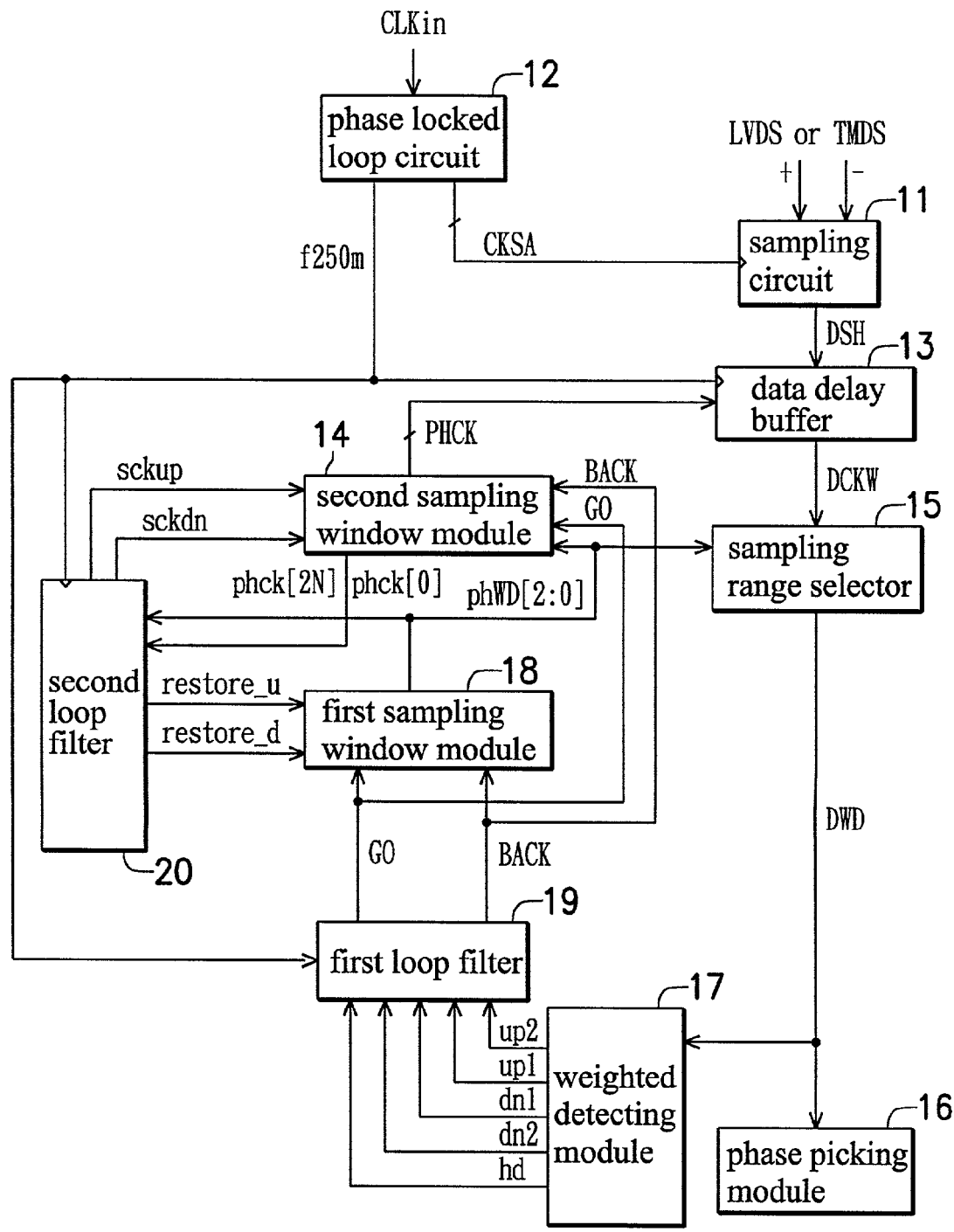
FIG. 1 is a block diagram of the data recovery device according to the embodiment of the present invention.

FIG. 1 is a block diagram of the data recovery device according to the embodiment of the present invention.

First, the high-speed signal LVDS or TMDS is input to the sampling circuit 11, here, for example, the bit number of the LVDS is four, and the frequency of LVDS is 1 GHz. At the same time, a plus signal CLKin with 100 MHz is input to the phase locked loop circuit 12, then the phase locked loop circuit 12 outputs a plus signal CKSA of 250 MHz and a plus signal f250 M. The plus signal CKSA is transformed from the plus signal CLKin by the phase locked loop circuit 12. Here, the plus signal CLKin is 100 Hz, and the phase locked loop circuit 12 increases the frequency of the plus signal CLKin by a factor of b/a to generate the signals with 250 MHz, wherein "a" is 2 and "b" is 5. In addition, there are 20 phases in the plus signal CKSA, which is input to the sampling circuit 11.

Figure 2:
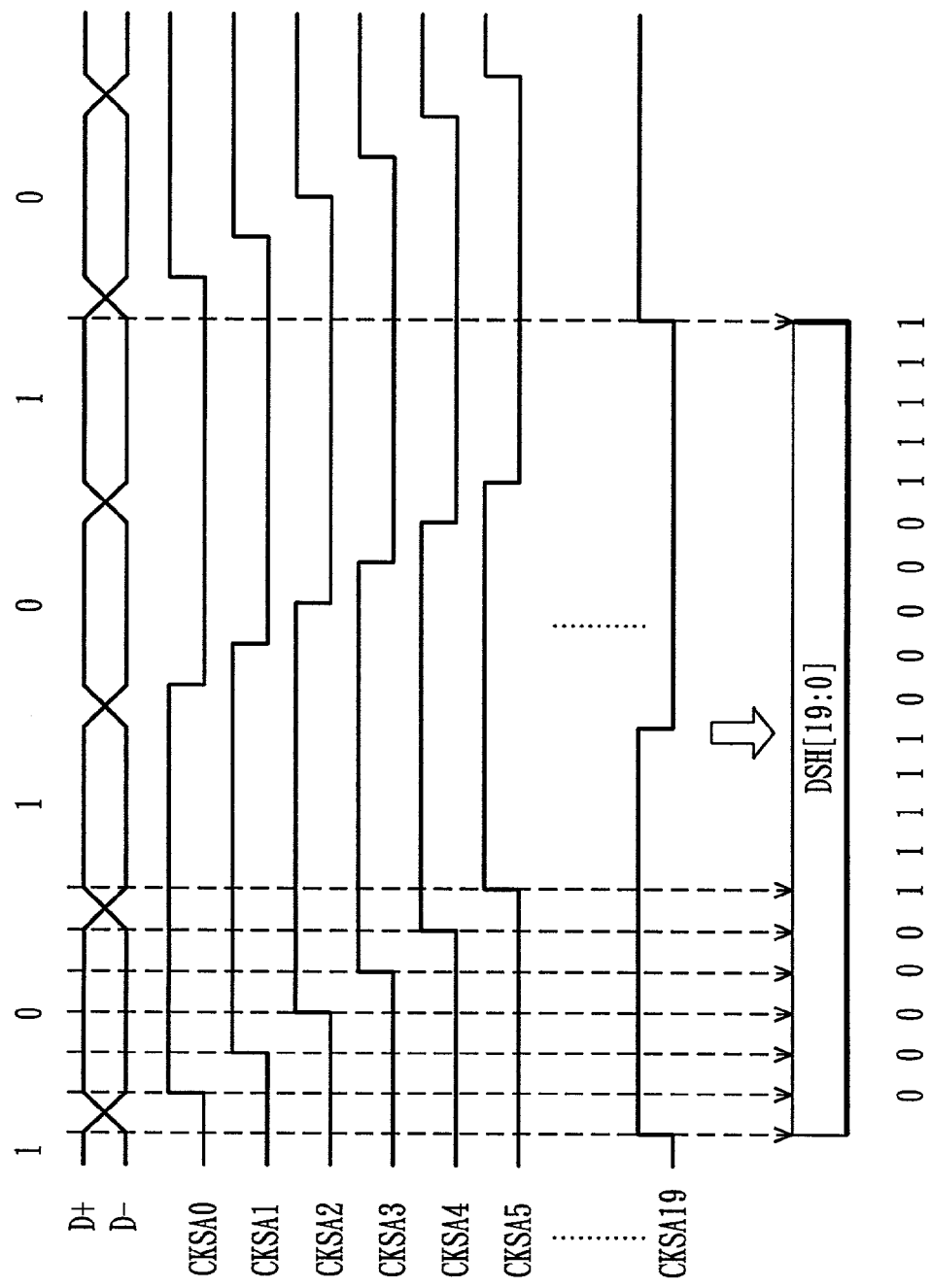
FIG. 2 is a chart showing the data sampling according to the embodiment of the present invention.

FIG. 2 is a chart showing the data sampling according to the embodiment of the present invention. The high-speed signal is locked by the signal having 20 phases. Because the 20 phases comprise four bits, each bit is sampled five times to generate a DSH signal having 20 bits. As shown in FIG. 2, the signal /0,1,0,1/ is transformed by the sampling circuit 11 to generate a signal /0,0,0,0,0,1,1,1,1,1,0,0,0,0,0,1,1,1,1,1/.

Afterward, the DSH signal is output to data delay buffer 13 to delay the data. At this time, the sampling window is defined by the phase of the signal PHCK[2N:0] provided by the second sampling window module 14. The data delay buffer 13 delays the 20 bits-DSH signal by f250M three times to generate the data with 60, bits which are Pre[19:0], Now[19:0], Next[19:0]•PHCK[2N:0]. The signal PHCK[2N:0] has 2N+1 phases, whereby the number N is determined by the shifting degree of the transmission system. For example, the parameter "a" of the phase locked loop circuit 12 is 4, the parameter "b" of the phase locked loop circuit 12 is 10, the plus signal CLKin is 100 MHz, and CLKin/a×b is 250 MHz. Therefore, the adjusted frequency of the phase locked loop circuit 12 is 25 MHz (the period T is 40 ns). If N is 2, the data picked in the first sampling range can shift two phases at most, hence, $\Delta T$ is $\Delta T$ is 400 ns($2\times1/(1$ GHz$\times5$)), and $\Delta T/T$ is $\pm1\%$ ($\pm400$ ps/40 ns). Therefore, the higher "N" is, the larger the range to be adjusted, but the larger the hardware resource required. In the present invention, the value "N" is 2, so the iocked value is 22.

Afterward, the signal DCKW is input to the sampling range selector 15 from data delay buffer 13. The sampling range selector 15 samples the signal DCKW to pick 20 signals from the 22 signals to generate signal DWD[19:0] according to the signal PHWD[2:0]. If the signal PHWD is /010/, the sampling range selector 15 samples the middle signals, if the signal PHWD is /001/, the sampling range selector 15 samples the right side signals, and if the signal PHWD is /100/, the sampling range selector 15 samples the left side signals. For example, if the signal DCKW is /1000001111100000111110/, the signal DWD is /00000111110000011111/ when PhWD is /010/, the signal DWD is /00001111100000111110/ when PhWD is /001/, and the signal DWD is [10000011111000001111] when PhWD is /100/.

Figure 3:
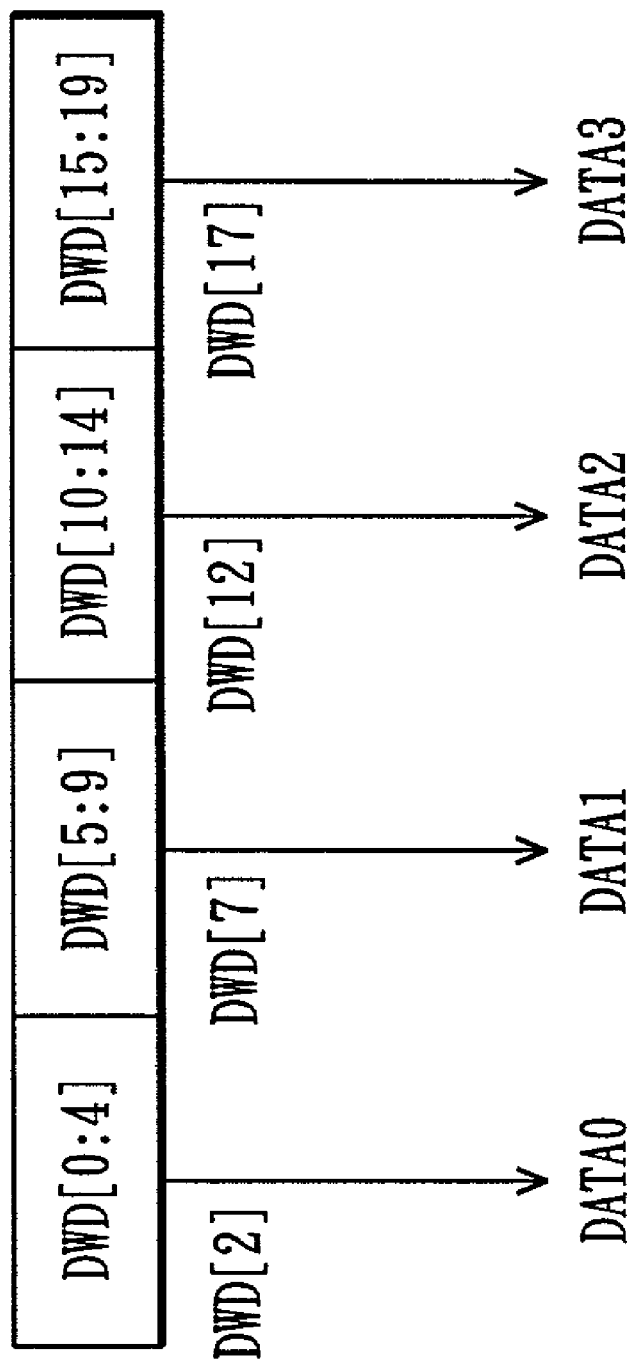
FIG. 3 is a chart showing the data sampled by the phase picking module according to the embodiment of the present invention.

Afterward, the signal DWD[19:0] is input to the phase picking module 16 and the weighted detecting module 17. FIG. 3 is a chart showing the data sampled by the phase picking module according to the embodiment of the present invention. The middle bit of the five DWD signals is picked by the phase picking module 16 for output.

There are five parameters comprised in the signal input to the weighted detecting module 17, up2, up1, hd, dn1, and dn2. If the data is shifted one bit to the left, then parameter "m1" is 1, if the data is shifted two bits to the left, then parameter "m2" is 1, if the data is shifted one bit to the right, then parameter "p1" is 1, and if the data is shifted two bits to the right, then parameter "p2" is 1. Afterward, the four groups (p2, p1, m1, m2) are added to each other to generate a sum (P2, P1, M1, M2). Then the parameter (up2, up1, dn1, dn2, hd) is defined according to the sum (P2, P1, M1, M2). The condition is:

If P2≧2, then (up2, up1, dn2, dn1, hd) is (1,0,0,0,0).
If P1≧2, then (up2, up1, dn2, dn1, hd) is (0,1,0,0,0).
If M1≧2, then (up2, up1, dn2, dn1, hd) is (0,0,1,0,0).
If M2≧2, then (up2, up1, dn2, dn1, hd) is (0,0,0,1,0).
Otherwise, (up2, up1, dn2, dn1, hd) is (0,0,0,0,1).

Figure 4A:
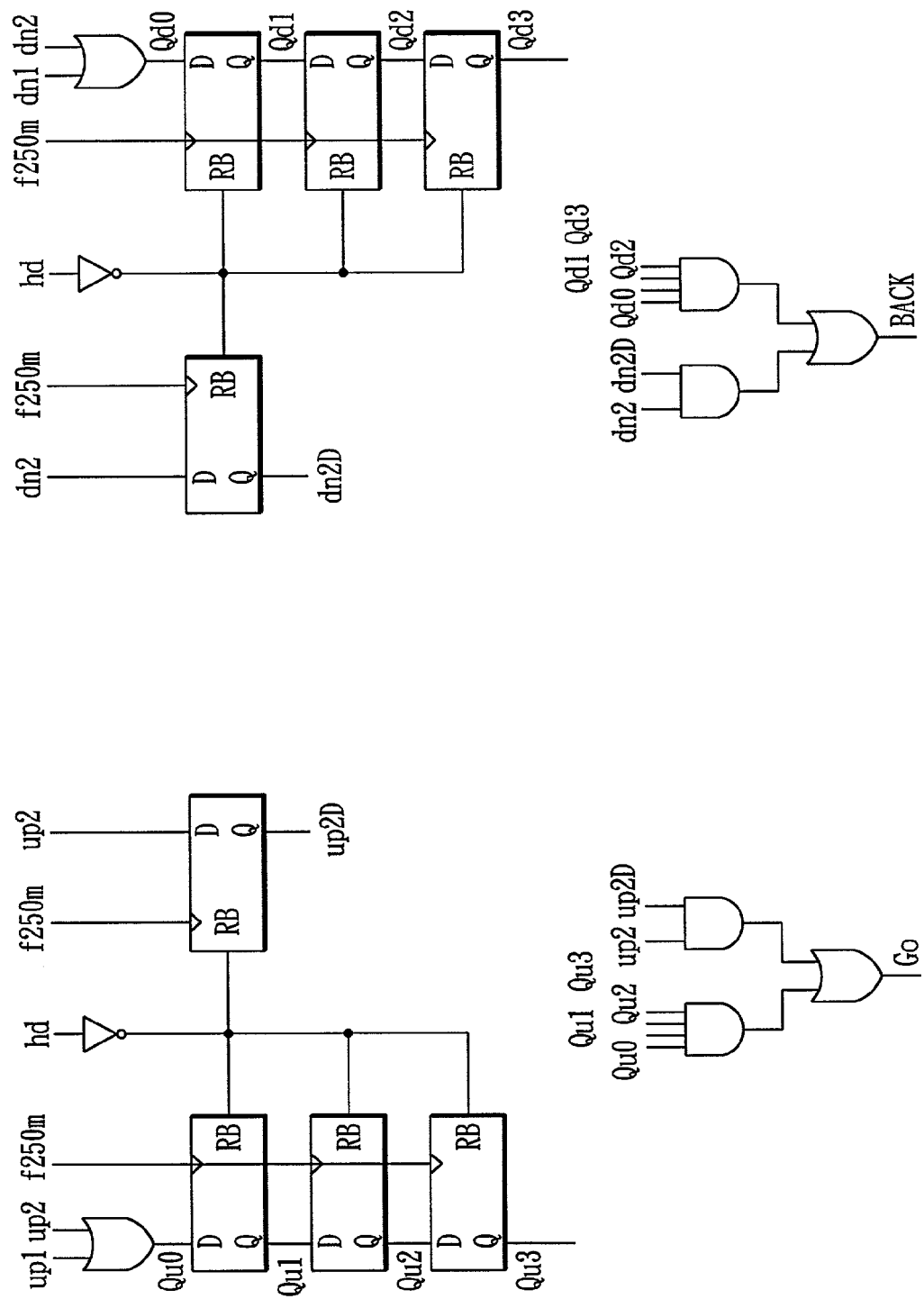
FIG. 4A is a circuit diagram showing the first loop filter according to the embodiment of the present invention.

Afterward, the data (up2, up1, dn2, dn1, hd) is input to the first loop filter 19. FIG. 4A is a circuit diagram showing the first loop filter according to the embodiment of the present invention. The first loop filter 19 outputs the signals GO and BACK to the second sampling window module 14 and the first sampling window module 18. The condition is:

When there are two successive signals up2 input to the first loop filter 19, the signal GO is 1.
When there are two successive signals up1 input to the first loop filter 19, the signal GO is 1.
When there are two successive signals dn2 input to the first loop filter 19, the signal BACK is 1.
When there are two successive signals dn1 input to the first loop filter 19, the signal BACK is 1.
Otherwise, the signal GO is 0, and the signal BACK is 0.

Therefore, the short time skew tolerance is 5% ((±2×200 ps)/(2×4 ns)).

Figure 4B:
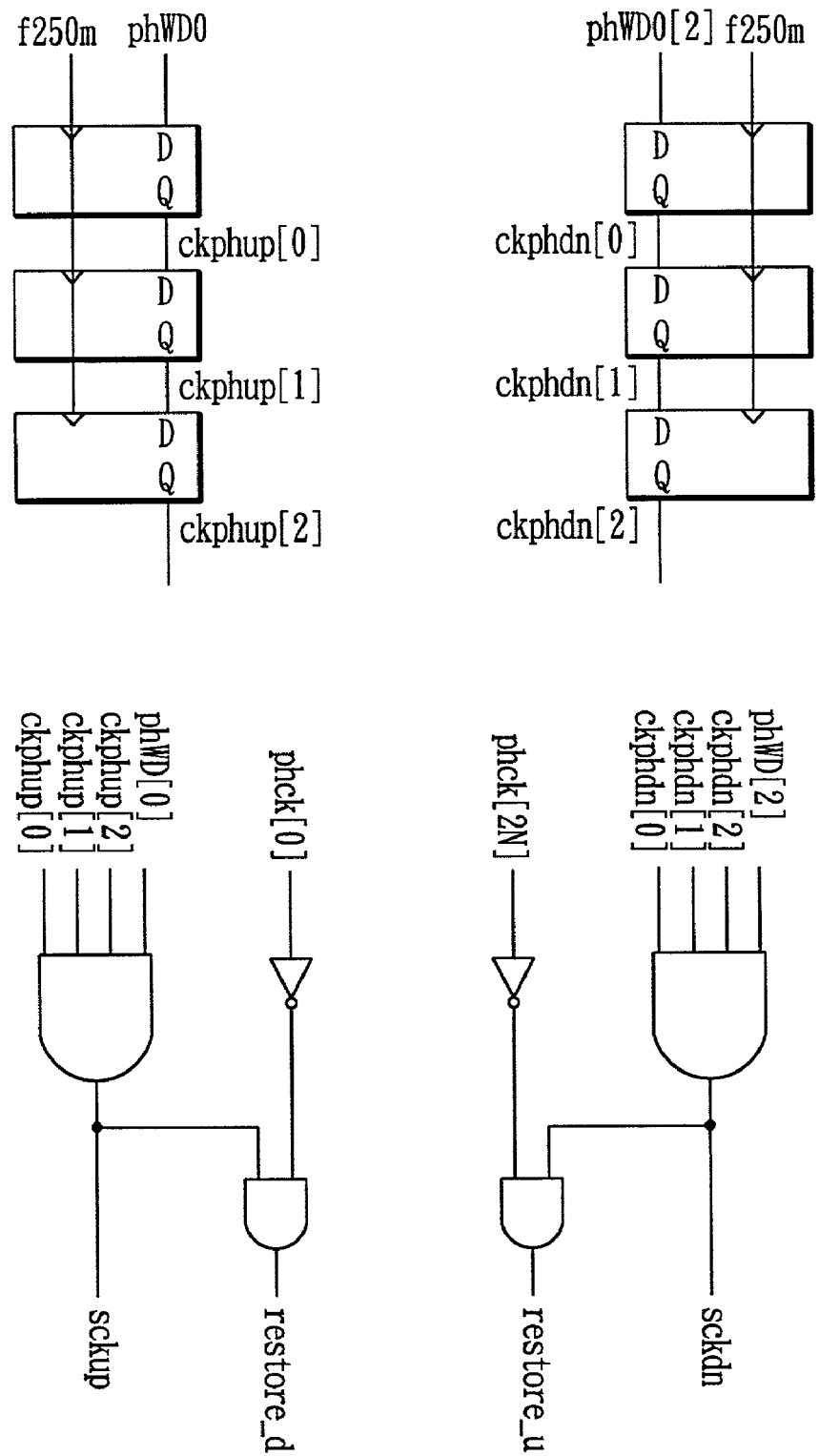
FIG. 4B is a circuit diagram showing the second loop filter according to the embodiment of the present invention.

FIG. 4B is a circuit diagram showing the second loop filter 20 according to the embodiment of the present invention. The second loop filter 20 controls the operation of the second sampling window module 14 according to the signals sckup and sckdn responding to the signals phck[2N], phck[0], phWD[2:0] and f250M.

The condition is:
When four successive pulses f250M constantly stay at phwd001, the signal sckup is 1.
When four successive pulses f250M constantly stay at phwd100, the signal sckdn is 1.

If the signal phck[2N] is not 1, the signal restore_u is the same as signal sckdn, therefore, the signal phWD is reset as /010/ after the signal phck is moved.

If the signal phck[0] is not 1, the signal restore_d is the same as signal sckup, therefore, the signal phWD is reset as /010/ after the signal phck is moved.

Finally, the second sampling window module 14 adjusts the first sampling range according to the signals sckdn, sckup, phWD, GO, and BACK.

Figure 5A:
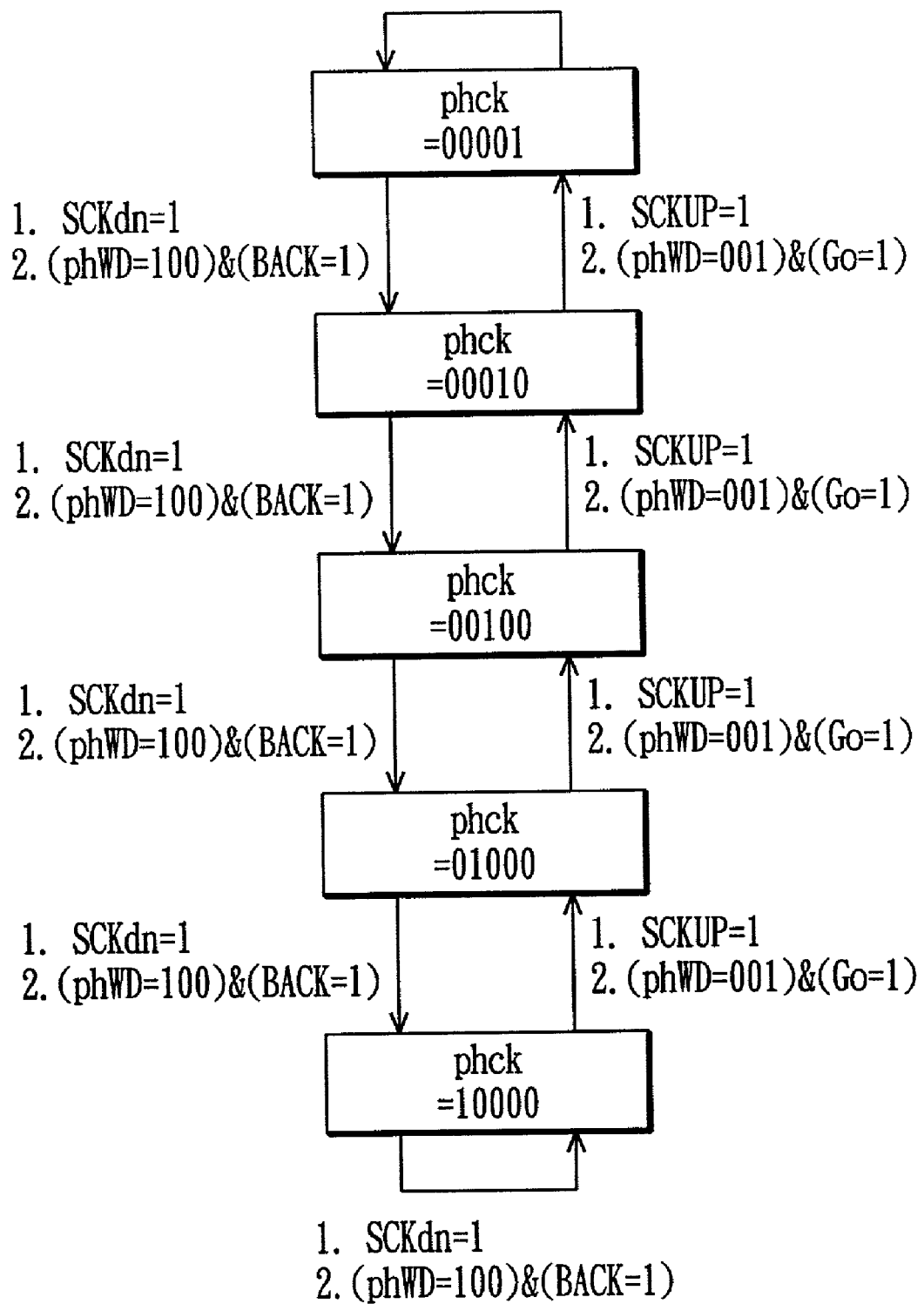
FIG. 5A is a flow chart showing the determination of the second sampling window module according to the embodiment of the present invention.

FIG. 5A is a flow chart showing the determination of the second sampling window module 14 according to the embodiment of the present invention.

(a) If the signal phWD is /001/ or the signals phWD is /001/ and GO is '1', the second sampling window module 14 moves up the signal PHCK. However, if the signal PHCK[0] is 1, the signal PHCK will not be changed.

(b) If the signal phWD is /001/ or the signals phWD is /100/ and BACK is '1', the second sampling window module 14 moves down the signal PHCK. However, if the signal PHCK[2N] is 1, the signal PHCK will not be changed.

Figure 5B:
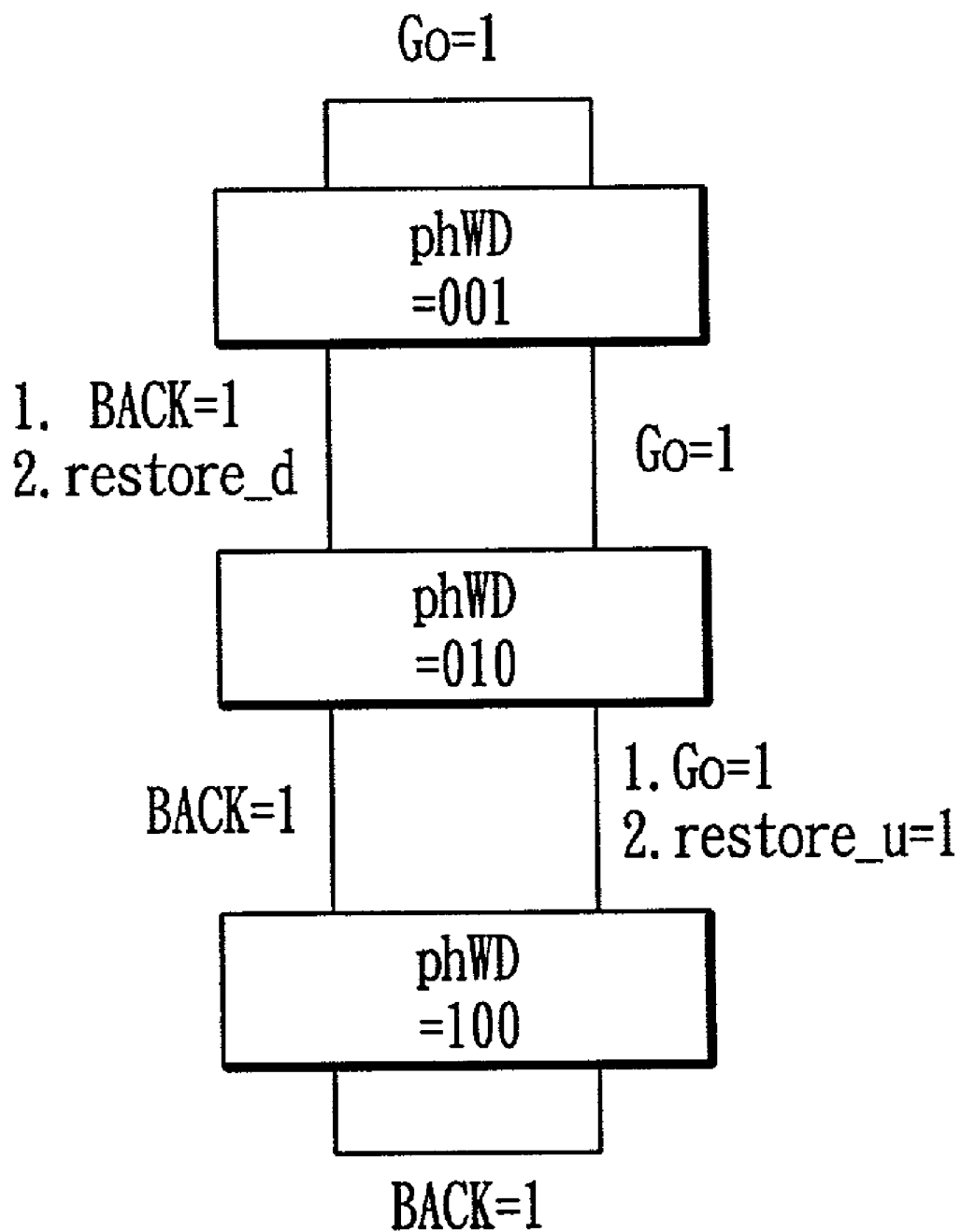
FIG. 5B is a flow chart showing the determination of the first sampling window module according to the embodiment of the present invention.

FIG. 5B is a flow chart showing the determination of the first sampling window module 18 according to the embodiment of the present invention.

If the signal GO is 1, the PHWD is moved up.
If the signal BACK is 1, the PHWD is moved down.
If the signal PHWD is /001/ and the signal GO is 1, the value of the signal PHWD is not changed. And if the signal restore_d is 1, the value of the signal PHWD is restored to /010/.

If the signal PHWD is /100/ and the signal BACK is 1, the value of the signal PHWD is not changed. And if the signal restore_u is 1, the value of the signal PHWD is restored to /010/.

Therefoore, the signal phWD doesn't change from /100/ to /001/ or from /001/ to /100/ by the determination of the first sampling window module 18 and the second sampling window module 14 to avoid the signal overflow and underflow. Moveover, the signal phWD is controlled by the signal phck to hold its value at, /010/, so the adjustment is easier. In addition, the phases of the signal phck can be adjusted to obtain larger dynamic adjusting range.

Figure 6:
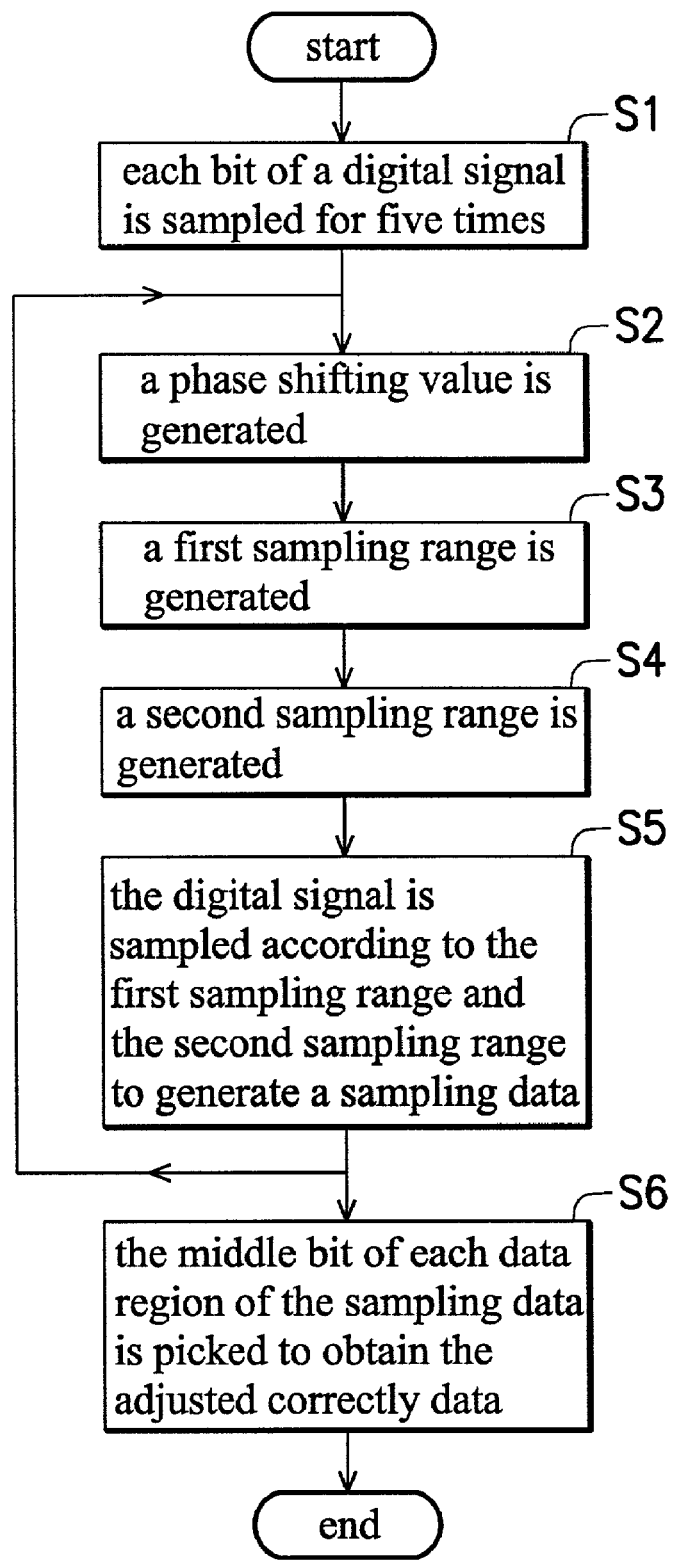
FIG. 6 is a flow chart showing the data recovery method according to the embodiment of the present invention.

FIG. 6 is a flow chart showing the data recovery method according to the embodiment of the present invention.

First, each bit of a digital signal is sampled five times (S1). In this embodiment, the digital signal can be a low-voltage swing differential signal. Afterward, a phase shifting value is generated according to the digital signal (S2). Afterward, a first sampling range is generated according to the phase shifting value (S3). Next, a second sampling range is generated according to the first sampling range (S4), and the second sampling range is adjusted when the first sampling range shifts and reaches a predetermined degree or maintains a predetermined state for a predetermined time. In this embodiment, the predetermined degree represents the first sampling range shifting to a direction continuously, the predetermined state represents the phase of the first sampling range leading or lagging with respect to one phase of the first sampling range, and the predetermined time is defined according to the real circuit design. Next, the digital signal is sampled according to the first sampling range and the second sampling range to generate sampled data (S5). Finally, the middle bit of each data region of the sampling data is picked to obtain the correctly adjusted data (S6).

In addition, the sampling data obtained in step S5 can further be fed back to step S2 to obtain another phase shifting value, then the follow-up steps are performed to obtain more correct data.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A data recovery device for adjusting a digital signal according to a pulse signal output by a phase-locked loop circuit, comprising:
    a sampling circuit coupled to the phase-locked loop circuit for sampling each bit of the digital signal at least twice according to the pulse signal to generate a first sampling signal;
    a data delay buffer coupled to the sampling circuit for deciding a sampling range of the first sampling signal according to a first phase checking signal and outputting a second sampling signal;
    a sampling range selector coupled to the data delay buffer for picking a part of bits of the second sampling signal according to a phase picking signal and outputting output data;
    a weighted detecting module coupled to the sampling range selector for outputting a phase shifting signal responding to the output data;
    a first loop filter coupled to the weighted detecting module for outputting a first adjusting signal according to the phase shifting signal;
    a first sampling window module coupled to the sampling range selector for outputting a phase selecting signal according to the first adjusting signal and a recovery signal;
    a second loop filter coupled to the first sampling window module and the phase-locked loop circuit for outputting the recovery signal and a second adjusting signal according to the phase selecting signal and a second phase checking signal;
    a second sampling window module coupled to the first loop filter and the second loop filter for outputting the first phase checking signal and the second phase checking signal according to the first adjusting signal and the second adjusting signal; and
    phase picking module couple to the sampling range selector for outputting the output data.

2. The data recovery device as claimed in claim 1, wherein the middle bit of each data region of the output data is picked by the phase picking module.

3. The data recovery device as claimed in claim 2, wherein the digital signal is a low-voltage differential signal (LVDS) or a transition minimized differential signal (TMDS).

4. The data recovery device as claimed in claim 2, wherein the sampling range of the first sampling signal is determined by the data delay buffer according to a shifting degree of a transmitting system.

5. The data recovery device as claimed in claim 1, wherein the digital signal is a low-voltage differential signal (LVDS) or a transition minimized differential signal (TMDS).

6. The data recovery device as claimed in claim 5, wherein the sampling range of the first sampling signal is determined by the data delay buffer according to a shifting degree of a transmitting system.

7. The data recovery device as claimed in claim 1, wherein the sampling range of the first sampling signal is determined by the data delay buffer according to a shifting degree of a transmitting system.

8. A data recovery method, comprising the following steps:
    sampling each bit of a digital signal several times;
    generating a phase shifting value according to the digital signal;
    generating a first sampling range according to the phase shifting value;
        generating a second sampling range according to the first sampling range, and adjusting the second sampling range when the first sampling range shifts and reaches a predetermined degree or maintains a predetermined state for a predetermined time;
        sampling the digital signal according to the first sampling range and the second sampling range to generate sampled data; and
    picking a bit of each data region of the sampling data;
    wherein the digital signal is a low-voltage differential signal (LVDS) or a transition minimized differential signal (TMDS).

9. The data recovery method as claimed in claim 8, wherein the predetermined degree represents the first sampling range shifting to a direction continuously.

10. The data recovery method as claimed in claim 8, wherein the predetermined state represents the phase of the first sampling range leading or lagging.

11. The data recovery method as claimed in claim 10, wherein the predetermined time is adjustable.

12. The data recovery method as claimed in claim 8, wherein the bit of the data region is the middle bit of each data region of the sampling data.

13. The data recovery method as claimed in claim 8, wherein the step of generating the phase shifting value is to generate the phase shifting value according to the sampled data.

14. A data recovery method, comprising the following steps:
    sampling each bit of a digital signal several times;
    generating a phase shifting value according to the digital signal;
    generating a first sampling range according to the phase shifting value;
    generating a second sampling range according to the first sampling range, and adjusting the second sampling range when the first sampling range shifts and reaches a predetermined degree or maintains a predetermined state for a predetermined time;
    sampling the digital signal according to the first sampling range and the second sampling range to generate sampled data; and
    picking a bit of each data region of the sampling data;
    wherein the predetermined degree represents the first sampling range shifting to a direction over a threshold;
    wherein the step of generating the phase shifting value is to generate the phase shifting value according to the sampled data.

15. The data recovery method as claimed in claim 14, wherein the digital signal is a low voltage differential signal (LVDS) or a transition minimized differential signal (TMDS).

16. The data recovery method as claimed in claim 14, wherein the predetermined state represents the phase of the first sampling range leading or lagging.

17. The data recovery method as claimed in claim 16, wherein the predetermined time is adjustable.

18. The data recovery method as claimed in claim 14, wherein the bit of the data region is the middle bit of each data region of the sampling data.

* * * * *